(12) United States Patent
Sadohara et al.

(10) Patent No.: US 8,573,969 B2
(45) Date of Patent: Nov. 5, 2013

(54) SILICON WAFER HEAT TREATMENT METHOD

(75) Inventors: Shinya Sadohara, Kanagawa (JP); Kozo Nakamura, Kanagawa (JP); Shiro Yoshino, Kanagawa (JP)

(73) Assignee: Sumco TechXIV Corporation, Nagasaki (JP)

( * ) Notice: Subject to any disclaimer, the term of this patent is extended or adjusted under 35 U.S.C. 154(b) by 1258 days.

(21) Appl. No.: 12/443,365

(22) PCT Filed: Sep. 28, 2007

(86) PCT No.: PCT/JP2007/069024
§ 371 (c)(1),
(2), (4) Date: Mar. 27, 2009

(87) PCT Pub. No.: WO2008/038786
PCT Pub. Date: Apr. 3, 2008

(65) Prior Publication Data
US 2010/0075267 A1    Mar. 25, 2010

(30) Foreign Application Priority Data
Sep. 29, 2006   (JP) .................................. 2006-270064

(51) Int. Cl.
*F26B 11/02*   (2006.01)
*C01B 33/00*   (2006.01)
*C01B 33/02*   (2006.01)

(52) U.S. Cl.
USPC ............................... 432/1; 423/324; 423/348

(58) Field of Classification Search
None
See application file for complete search history.

(56) References Cited

U.S. PATENT DOCUMENTS

| | | | |
|---|---|---|---|
| 5,788,763 A * | 8/1998 | Hayashi et al. | 117/2 |
| 5,931,662 A * | 8/1999 | Adachi et al. | 432/6 |
| 6,294,726 B1 * | 9/2001 | Hassler et al. | 136/258 |
| 6,335,269 B1 * | 1/2002 | Sato | 438/509 |

(Continued)

FOREIGN PATENT DOCUMENTS

| | | |
|---|---|---|
| EP | 1 780 781 A1 | 5/2007 |
| JP | 09-190954 | 7/1997 |

(Continued)

OTHER PUBLICATIONS

Sueoka K et al., "*Effect of Oxide Precipitates Sizes on the Mechanical Strength of Czochralski Silicon Wafers*," Japanese Journal of Applied Physics, Japan Society of Applied Physics, JP, vol. 36, No. 12A, Part 01, Dec. 1, 1997, pp. 7095-7099, XP001110829, ISSN: 0021-4922, DOI: DOI:10.1143/JJAP.36.7095.

(Continued)

*Primary Examiner* — Kang Hu
*Assistant Examiner* — Eric Gorman
(74) *Attorney, Agent, or Firm* — Alston & Bird LLP

(57) ABSTRACT

A silicon wafer preferable to a semiconductor device is produced by determining a heat treatment condition hardly causing slip dislocations and heat-treating the silicon wafer under the condition. The resistance is calculated by using a calculation formula used for predicting the slip resistance of the wafer from the density, size, and residual solid-solution oxygen concentration of the oxygen precipitation in the silicon wafer, the state of oxygen precipitation such that heat treatment not causing any slip dislocation can be carried out is designed, and thus a silicon wafer heat treatment method under the heat treatment condition not causing any slip dislocation is determined. A silicon wafer heat-treated under such a condition can be provided.

7 Claims, 9 Drawing Sheets

(56) References Cited

U.S. PATENT DOCUMENTS

| | | | |
|---|---|---|---|
| 6,544,656 B1 * | 4/2003 | Abe et al. | 428/446 |
| 6,802,899 B1 * | 10/2004 | Tamatsuka | 117/13 |
| 7,033,962 B2 * | 4/2006 | Takeno | 438/799 |
| 7,141,113 B1 * | 11/2006 | Nakamura et al. | 117/3 |
| 7,397,110 B2 * | 7/2008 | Takase et al. | 257/611 |
| 7,637,997 B2 * | 12/2009 | Ono et al. | 117/15 |
| 2001/0049080 A1 * | 12/2001 | Asano et al. | 432/239 |
| 2002/0166581 A1 * | 11/2002 | Kondo et al. | 136/258 |
| 2002/0177094 A1 * | 11/2002 | Shirakawa | 432/4 |
| 2003/0017106 A1 * | 1/2003 | Abercrombie | 423/659 |
| 2003/0104332 A1 * | 6/2003 | Hrezo et al. | 432/59 |
| 2003/0198910 A1 * | 10/2003 | Goodman | 432/253 |
| 2004/0050318 A1 * | 3/2004 | Sakai | 117/13 |
| 2004/0171234 A1 * | 9/2004 | Takeno | 438/471 |
| 2004/0185662 A1 | 9/2004 | Fujisawa et al. | |
| 2004/0231759 A1 * | 11/2004 | Kobayashi et al. | 148/562 |
| 2005/0025691 A1 * | 2/2005 | Kobayashi et al. | 423/348 |
| 2005/0250349 A1 * | 11/2005 | Sadamitsu et al. | 438/800 |
| 2005/0253221 A1 * | 11/2005 | Takase et al. | 257/607 |
| 2005/0271566 A1 * | 12/2005 | Yadav | 423/1 |
| 2006/0130736 A1 * | 6/2006 | Takeno | 117/2 |
| 2007/0177126 A1 | 8/2007 | Fujisawa et al. | |
| 2009/0210166 A1 * | 8/2009 | Nakamura et al. | 702/23 |

FOREIGN PATENT DOCUMENTS

| | | |
|---|---|---|
| JP | 11-340239 | 12/1999 |
| JP | 2000-031224 | 1/2000 |
| JP | 2003-068746 | 3/2003 |
| JP | 2003-243404 | 8/2003 |
| JP | 2003-249501 | 9/2003 |
| JP | 2004-020286 | 1/2004 |
| JP | 2005-203575 | 7/2005 |
| JP | 2006-040980 | 2/2006 |
| WO | WO 03/003441 A1 | 1/2003 |
| WO | WO 2005/071144 A1 | 8/2005 |

OTHER PUBLICATIONS

Extended European Search Report of related European Patent Application No. 07828765.3-1235, dated Apr. 7, 2011.

Office Action from corresponding U.S. Appl. No. 12/361,929 dated Jun. 8, 2010.

Robert H. Nilson et al., Defects in Silicon III, Book, 1999, pp. 119-132, vol. 99-1, Electromechanical Society, Inc., Pennington, N.J.

M. Akatsuka et al., Calculation of Slip Length in 300 mm Silicon Wafers during Thermal Processes, Journal, 1999, pp. 2683-2688, vol. 146, Journal of the Electrochemical Society.

Dimitris Maroudas et al., Constitutive Modeling of the Effects o f Oxygen on the Deformation Behavior of Silicon, Journal, 1991, pp. 2337-2352, vol. 6, No. 11, Materials Research Society.

Toshiaki Ono et al., Wafer Strength and Slip Generation Behavior in 300mm Wafers, Book, 2005, pp. 109-122, vol. 2, No. 2, The Electrochemical Society.

Office Action from corresponding U.S. Appl. No. 12/361,929 dated Nov. 23, 2010.

* cited by examiner

SILICON WAFER HEAT TREATMENT METHOD

CROSS-REFERENCE TO RELATED APPLICATIONS

This application is based on PCT/JP2007/069024, filed Sep. 28, 2007, which claims priority to Japanese Application Number 2006-270064, filed Sep. 29, 2006, the contents of both of which are incorporated by reference.

FIELD OF THE INVENTION

The present invention relates to the art of designing a precipitation state of oxygen precipitates and a design technology of a thermal process so as to suppress generation of a slip dislocation in a silicon wafer sliced from a silicon single crystal ingot having been manufactured by a Czochralski method (including an MCZ method) such that a wafer of high quality may be provided.

BACKGROUND OF THE INVENTION

Silicon single crystal wafers, prepared by slicing a silicon single crystal ingot having been grown mainly with a Czochralski method (CZ method) and by polishing sliced wafers, are used as wafers for manufacturing semiconductor integrated circuits and other IC devices. In an IC device manufacturing process, various kinds of heat treatments are performed in diverse processes according to a configuration of the device.

When an excessive shear stress is applied to a wafer in such processes, a dislocation penetrating through the wafer is generated and this is observed as a slip. Warpage occurs in a wafer in which the slip is generated, and a slip dislocation becomes a cause of leak defect and significantly reduces device yield.

Since a thermal stress and a self-weight stress tend to increase, in particular, with a large-diameter wafer of 300 or more (mm), it is more likely that the slip is generated.

Meanwhile, when the silicon wafer is heat treated for 1 to 4 hours at a temperature of 1100 to 1300 (° C.) in a non-oxidizing atmosphere, wafer surface defects are effectively eliminated. However, the possibility of slip generation becomes high particularly in such a high temperature heat treatment.

It is considered that the slip may be generated when the shear stress based on a sum of the thermal stress and the self-weight stress generated in the wafer in the heat treatment process exceeds the shear strength of the crystal. Thus, many attempts have been made to design the process as shown in Non-Patent Document 1 such that the thermal stress may be equal or less than the shear strength of the crystal by obtaining the thermal stress and the self-weight stress generated in the heat treatment process in terms of calculation.

[Patent Document 1] Japanese Unexamined Patent Publication H09-190954;
[Patent Document 2] WO2003/003441;
[Patent Document 3] Japanese Unexamined Patent Publication 2003-68746;
[Patent Document 4] Japanese Unexamined Patent Publication 2003-249501;
[Patent Document 5] Japanese Unexamined Patent Publication 2006-040980;
[Patent Document 6] WO01/0034882;
[Patent Document 7] Japanese Unexamined Patent Publication 2003-243404;
[Patent Document 8] Japanese Unexamined Patent Publication 2005-203575;
[Patent Document 9] Japanese Unexamined Patent Publication H11-340239; and
[Patent Document 10] WO2005/071144.

[Non-Patent Document 1] Robert H. Nilson and Stewart K. Griffiths, Defects in Silicon III, Edited by T. Abe, W. M. Bullis, S. Kobayashi, W. Lin and P. Wagner (Electrochemical Society INC., Pennington N.J., 1999) Procceedings Volume 99-1, page 119;
[Non-Patent Document 2] M. Akatsuka, K. Sueoka, H. Katahama, and N. Adachi, Journal of The Electrochemical Society, Vol. 146 (1999) page 2683-2688;
[Non-Patent Document 3] Dimitris Mroudas and Robert A. Brown, Journal of Materials Research, Volume 6 (1991) page 2337; and
[Non-Patent Document 4] Toshiaki Ono, Wataru Sugimura, Takayuki Kihara, and Masataka Hourai, Silicon Materials Science and Technology X, Editors: H. Huff, H. Iwai, H. Richter, Electrochemical Society, Pennington, N.J., 2005, Volume 2 no. 2, p 109.

However, it is extremely difficult to avoid the slip generation in the high-temperature heat treatment with respect to the large-diameter silicon wafer. Also, it was believed that the wafer having a large amount of oxygen precipitates tended to have lower shear strength in accordance with the conventional view as shown in Non-Patent Document 1. This is because the crystal strength of the CZ silicon crystal is lowered by lowering the residual solid solution oxygen concentration inside the crystal due to progress of oxygen precipitation as the crystal strength is influenced by the oxygen concentration and the dislocation may be generated more readily by a strain that is brought by the oxygen precipitates.

However, it has been indicated that introduction of oxygen precipitates is effective for slip suppression as shown in Patent Documents 2, 3, 4, and 5 ever since it was pointed out by Patent Document 1 that a presence of oxygen precipitates has a slip suppressing effect.

Also, it is shown in Patent Documents 6, 7, and 8 that a slip suppressing effect acts on wafers in which an OSF (oxidation induced stacking fault) and a BSF (bulk stacking fault) are introduced. However, because the OSF is a defect caused by an oxygen precipitation nucleus and the BSF is a defect that is unavoidably accompanied by the oxygen precipitation, it is considered that the slip suppression effect is inherently the same effect as indicated in Patent Documents 1, 2, 3, 4, and 5.

Although it is indicated in Patent Documents 1, 2, 3, 4, and 5 that the introduction of oxygen precipitates causes a slip suppression effect, the strength may be lowered depending on the precipitation state as indicated in the conventionally accepted theory. However, it has not been disclosed whatsoever under what oxygen precipitation circumstances the strength against the slip is increased or decreased. This is because the relationship between the state of oxygen precipitates and the strength against the slip is completely unknown.

In general, the heat stress and the self-weight stress loaded on the wafer differ according to each heat treatment condition and the strength against the slip capable of suppressing the slip generation under such load may also differ accordingly. Therefore, the suitable oxygen precipitation state may also differ. Under such circumstances, it was the only way to determine the suitable condition by trial and error in the technologies disclosed in Patent Documents 1, 2, 3, 4, and 5. Therefore, it was necessary to fulfill an immense task of carrying out the whole heat processes, thereafter examining existence of the slip, and then selecting more suitable conditions by trial and error.

BRIEF SUMMARY OF THE INVENTION

In view of the above issue, in the present invention, a method of calculating a strength against a slip of a silicon wafer from a density of oxygen precipitates, a typical size thereof, and a residual solid solution oxygen concentration in the silicon wafer has been provided, and a method of designing an oxygen precipitation state that allows the heat treatment to be performed without generation of a slip dislocation and a method of designing the heat treatment method so as not to generate a slip dislocation have been provided. Also, ranges of the oxygen precipitation density and the precipitated oxygen amount that are effective for suppressing the slip generation are provided, and a method of realizing such a state of oxygen precipitation is proposed.

BRIEF DESCRIPTION OF THE DRAWINGS

Reference will now be made to the accompanying drawings, which are not necessarily drawn to scale, and wherein numerals 1, 2, 3, 4, 5, 6, on the figures pertain to slip directions.

DESCRIPTION OF THE INVENTION

A slip is generated when a shear stress based on a sum of a thermal stress and a self-weight stress generated in a wafer in a heat treatment process exceeds a shear strength of the crystal. The self-weight stress can be determined readily by a commercially available calculation system based on a finite element method. Many well-known systems, such as NASTRAN, ABAQUS, ANASYS, etc., are commercially available. The present inventors used NASTRAN.

Figure 1:
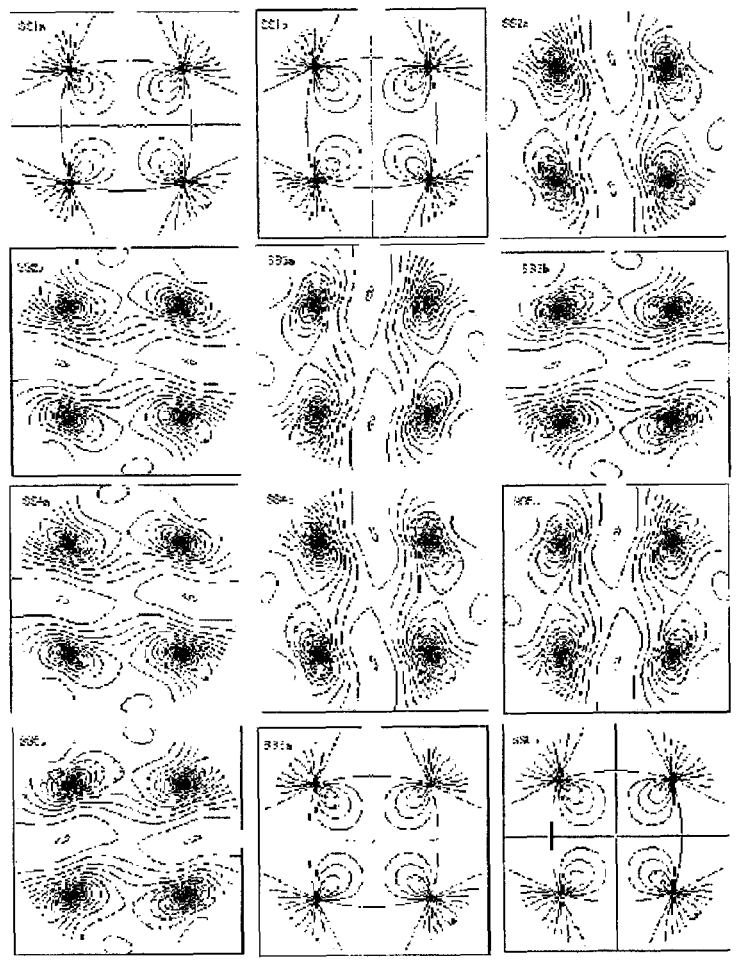
FIG. 1 shows plane distributions of shear stresses obtained by a finite element method
Figure 2:
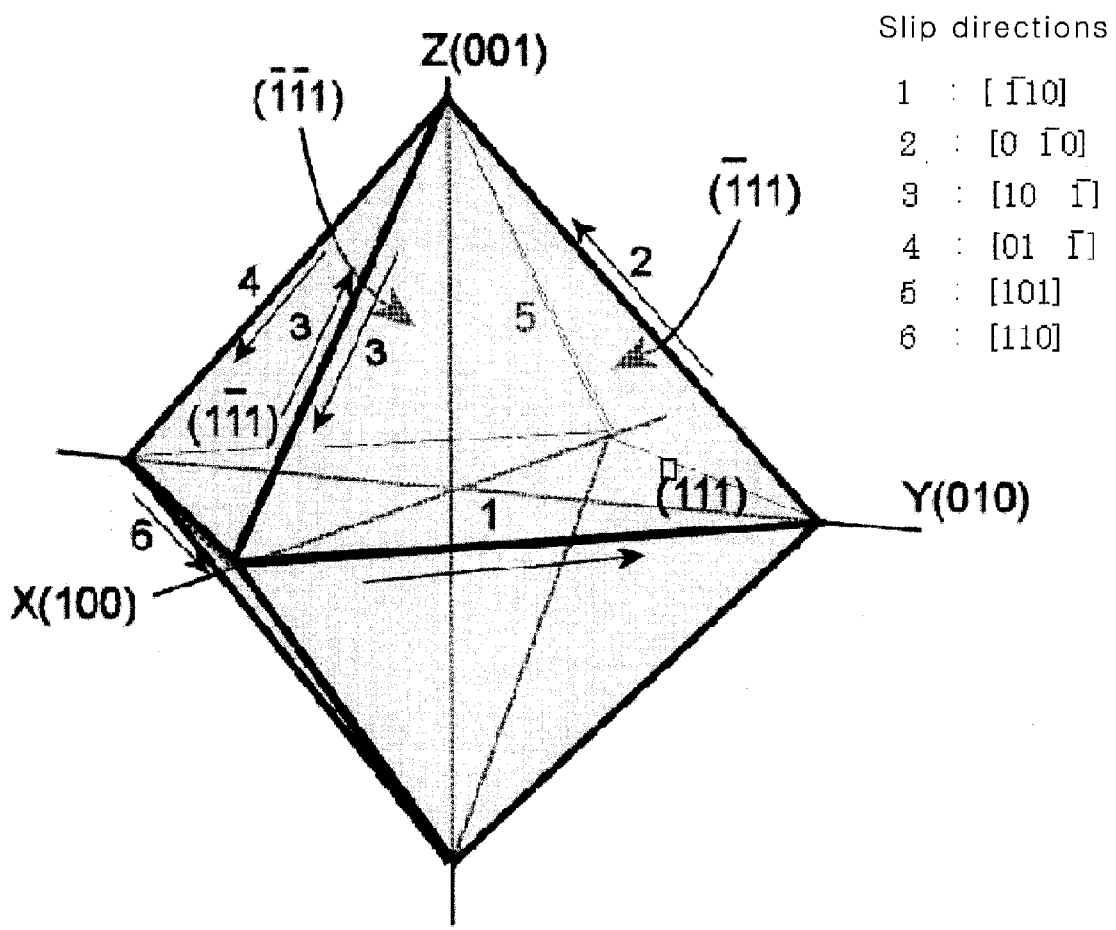
FIG. 2 illustrates slip planes and slip directions in the silicon crystal.

FIG. 1 shows a shear stress distribution in the case where a wafer with 300 mm in diameter and 775 micrometer in thickness is supported at four points positioned 105 mm away from the center. Although the analysis is performed by determining a maximum shear stress among the shear stresses in the slip analysis of a polycrystalline body, it is necessary to consider the slip planes for the slip analysis of a monocrystalline body such as a silicon wafer because the plane and the direction in which the slipping (slip) occurs are specified. In silicon, the slipping occurs in <110> directions in {111} planes. The slip planes and the slip directions in the silicon crystal are shown in FIG. 2. All planes forming an octahedron are included in the {111} planes, and ridgelines 1 to 6 lie in the <110> directions. It should be understood that it is necessary to determine twelve types of shear stresses since slips may occur in three <110> directions with respect to four {111} planes if the equivalent planes and directions are eliminated.

The twelve types of shear stress may be determined by conversion of stresses determined in the orthogonal coordinate system into shear stresses in the respective slip directions in the respective slip planes. Assuming the slip plane is indicated as the (ijk) plane and the slip direction is indicated as the [lnm] direction, the shear stress in the [lmn] direction applied to the (ijk) plane may be determined by Formula (A) as shown below.

[Formula 1]

$$\tau_{(ijk)[lmn]} = \frac{[l(i\sigma_{xx} + j\sigma_{xy} + k\sigma_{xz}) + m(i\sigma_{xy} + j\sigma_{yy} + k\sigma_{yz}) + n(i\sigma_{xz} + j\sigma_{yz} + k\sigma_{zz})]}{\sqrt{(i^2 + j^2 + k^2)(l^2 + m^2 + n^2)}} \quad (A)$$

The twelve diagrams in FIG. 1 indicate distributions of shear stresses within the wafer planes for respective combinations of the {111} planes and the <110> directions.

Thermal stress can be determined readily as described in Non-Patent Documents 1 and 2 and Patent Document 9, etc. The thermal stress arises from a temperature difference in a radial direction of a wafer, and the stress distribution is axially symmetrical. If T(r) is a temperature distribution in the radial direction, stresses in the radial direction and a circumferential direction may be determined by Formulae (B-1) and (B-2) as shown below.

[Formula 2]

$$\sigma_r(r) = \alpha E \left\{ \frac{1}{R^2} \int_0^R T(r')r' \, dr' - \frac{1}{r^2} \int_0^r T(r')r' \, dr' \right\} \quad (B\text{-}1)$$

$$\sigma_\theta(r) = \alpha E \left\{ -T(r) + \frac{1}{R^2} \int_0^R T(r')r' \, dr' + \frac{1}{r^2} \int_0^r T(r')r' \, dr' \right\} \quad (B\text{-}2)$$

In the above, r indicates a position in the radial direction of the wafer, R is an outer radius of the wafer, α is a thermal expansion coefficient, and E is a Young's modulus of the silicon crystal. The temperature distribution T(r) generally takes on a parabolic distribution shape such as expressed by Formula (C) as shown below.

[Formula 3]

$$T(r) = T_0 + a \times r^2 \quad (C)$$

Formulae (B) can thus be simplified to become Formulae (D-1) and (D-2) as shown below.

[Formula 4]

$$\sigma_r(r) = \frac{\alpha E \Delta T}{4}\left\{1 - \left(\frac{r}{R}\right)^2\right\} \quad (D-1)$$

$$\sigma_\theta(r) = \frac{\alpha E \Delta T}{4}\left\{1 - 3\left(\frac{r}{R}\right)^2\right\} \quad (D-2)$$

Figure 3:
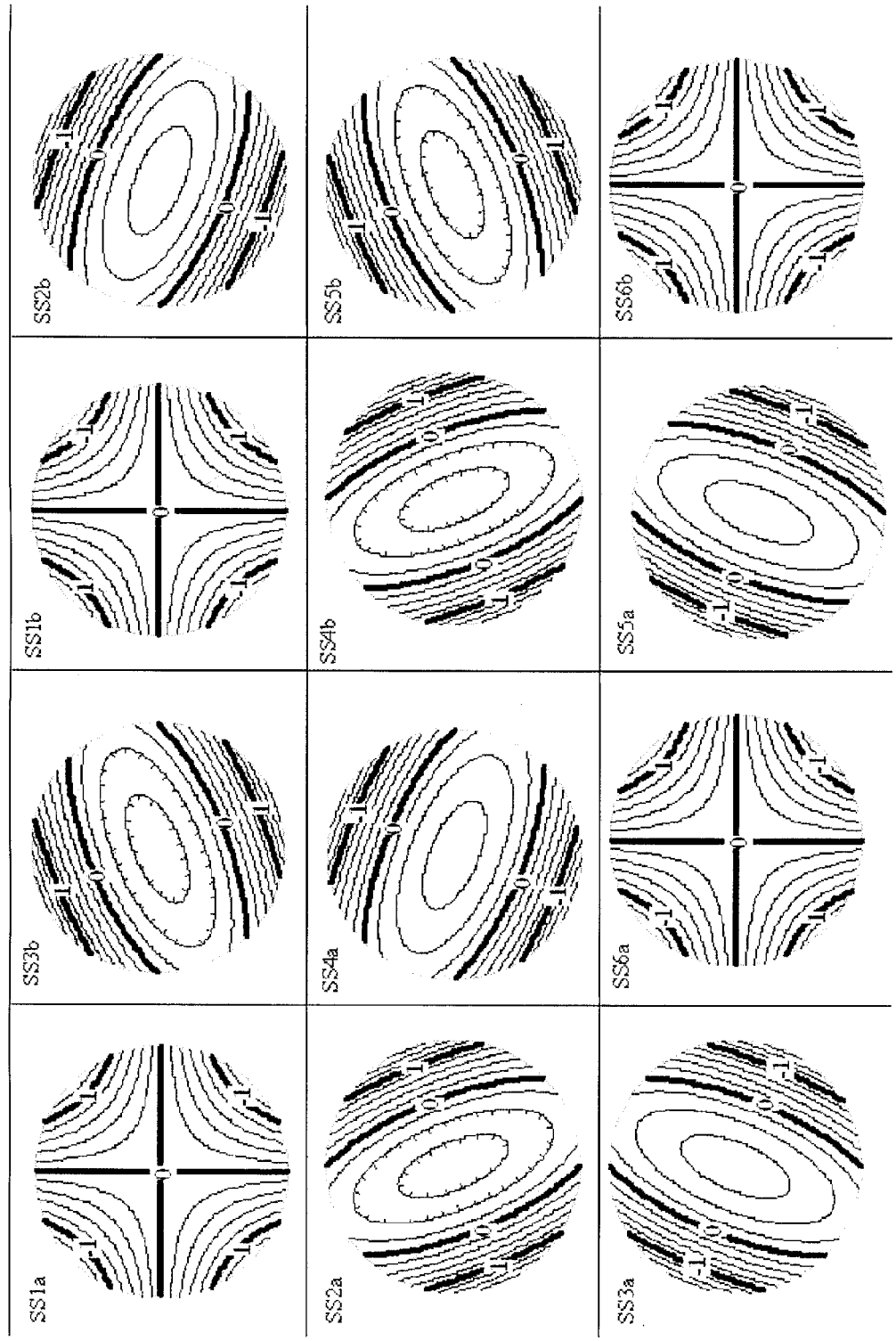
FIG. 3 shows distributions of thermal stresses.

In the above, ΔT is a temperature difference between the center and an outer circumference of the wafer. If ΔT is known, the thermal stress distribution can be made known. It is described in Non-Patent Documents 1 and 2 and Patent Document 9, etc., that ΔT is determined by a diameter, a thickness, a rate of temperature increase, and an interval distance between wafers. Since it is usual that the diameter and the thickness of the wafer are fixed, the ΔT is practically determined by the rate of temperature increase and the interval distance between the wafers. These can be determined readily by methods described in Non-Patent Documents 1 and 2 and Patent Document 9, etc. The stress thus determined is then converted in the twelve types of shear stresses contributing to the slipping in a similar manner as in the case of the self-weight stress. FIG. 3 shows an example of distributions of shear stresses that contribute to the slipping when there is an in-plane temperature difference of 10 (° C.). A sum of the shear stresses contributing to the slipping based on the self-weight stress and the thermal stress is then determined and compared with the strength of the crystal.

The present inventors found a method of calculating strength against the slip of the silicon wafer from a density of oxygen precipitates and a size thereof and a residual solid solution oxygen concentration in the wafer. The present inventors further found that the slip is not generated when the value of the strength against the slip is made higher than the value of the stress determined by the above-described method.

The method of calculating the strength against the slip is described as follows.

The present inventors considered that a shear stress necessary for a slip dislocation to progress to penetrate through a wafer must exceed a sum of the following two stresses.

One is a pinning force caused by solid solution oxygen. The pinning force having a similar nature to the frictional resistance prevents movement of the dislocation in a similar way, and unless the shear stress equal to or greater than the pinning force acts on the dislocation, the dislocation does not move. The value thereof is indicated in Non-Patent Document 3 and may be determined by Formula (E) as shown below.

[Formula 5]

$$\tau_1(Pa) = 2.2 \times 10^{-13} \cdot Co \cdot \exp(0.215 \text{ eV}/kT) \quad (E)$$

Here, Co is a solid solution oxygen concentration (atoms/cm3; JEITA), k is the Boltzmann constant, and T is a temperature in the absolute temperature (K). It may be understood that the activation energy is extremely as low as 0.215 eV such that the pinning force may hardly have the temperature dependence although the pinning force is proportional to the solid solution oxygen concentration.

The other is a shear stress necessary to move the dislocation such that the dislocation continues to move even passing through a trap caused by the oxygen precipitates due to the necessitated shear stress. Assuming that the mechanism by which the dislocation passes through the obstacles such as oxygen precipitates is the Orowan mechanism that is the simplest one and well known, the following shear stress may be required. Thus, if the shear stress is referred to as a block force (τ2), it may be obtained by the following Formula (F) as shown below.

[Formula 6]

$$\tau_2(Pa) = b \cdot \mu / L \quad (F)$$

Here, b is a magnitude of the Burgers vector in the silicon crystal, which is $0.384 \times 10^{-7}$ (cm), and μ is a modulus of rigidity of the silicon crystal, which is determined by Formula (G) as shown below.

[Formula 7]

$$\mu(Pa) = 6.975 \times 10^{10} - 5.82 \times 10^6 \cdot T(K) \quad (G)$$

Also, L (cm) is an interval distance between the obstacles with respect to the dislocation. From the above Formulae, it should be understood that the temperature dependence of the modulus of rigidity is extremely small and that, in a similar manner as in the case of the pinning force caused by oxygen, the temperature dependence of the blocking force is extremely small.

Here, the interval distance L of the obstacles is considered to be an average interval distance of the oxygen precipitates in the {111} plane that is the slip plane in which the dislocation moves. The oxygen precipitates typically have a plate-like shape riding on the {100} plane, which is inclined by 54.7° from the {111} plane. Thus, the average interval distance between the plate-like precipitates that interfere with the dislocation passing through the specific {111} plane, letting N (counts/cm3) be the density of the oxygen precipitates and D (cm) be the diameter of the oxygen precipitate, is given by Formula (H) as shown below.

[Formula 8]

$$L = 1/(N \cdot D \cdot \cos(54.7°))^{1/2} \quad (H)$$

If the oxygen precipitates are assumed to be spherical and the diameter thereof is Ds (cm), the average interval distance is given by Formula (I) as shown below.

[Formula 9]

$$L = 1/(N \cdot Ds)^{1/2} \quad (I)$$

In Non-Patent Document 4, the blocking force determined by Formula (F) is evaluated by letting L=1/N1/3 so as to estimate the strength of the wafer. However, in the case of L=1/N1/3, L signifies a lattice interval when the oxygen precipitates are positioned in the cubic lattice. That is, it is supposed that the calculation provides the average interval distance when the dislocation passes through the plane in which the oxygen precipitates are positioned most densely in the lattice of the oxygen precipitates positioned in the cubic lattice. The estimate is, as it were, a minimum estimate.

The dislocation in the silicon crystal moves on {111} planes, and it is not easy for the dislocation to move from one of the {111} planes on which the dislocation is now moving to another of the {111} planes. The dislocation, therefore, moves on the specific {111} atomic plane. Thus, it is clear that the average interval distance of the oxygen precipitates that act as obstacles against the movement of the dislocation is expressed by Formulae (H) and (I).

For example, in the case where the density is 109 (cm-3), although it is determined that L=10 (μm) regardless of the diameter of the precipitates by the estimate based on L=1/N1/3, the effective average interval distance differs depending on the diameter as viewed in a direction perpendicular to the specific {111} plane, in accordance with the calculation of the present invention, and then, it is calculated that L=316 (μm) when the diameter is 10 (nm) and it is calculated that L=100 (μm) when the diameter is 100 (nm). Thus, it can be understood that the average interval distance is evaluated too short by the estimate based on L=1/N1/3, and the strength is, therefore, evaluated too high.

When the average interval distance is thus given, the blocking force τ2 in the case where the precipitates are in the general plate-like form is determined by Formula (J) as shown below.

[Formula 10]

$$\tau_2 = \mu \cdot b \cdot (N \cdot D \cdot \cos(54.7°))^{1/2} \quad (J)$$

A resisting force τ against the development of the slip is considered to be expressed by Formula (K) as shown below.

[Formula 11]

$$\begin{aligned} \tau &= \tau_1 + \tau_2 \\ &= 2.2 \times 10^{-13} \cdot Co \cdot \exp(0.215\ eV/kT) + \\ &\quad \mu \cdot b \cdot (N \cdot D \cdot \cos(54.7°))^{1/2} \end{aligned} \quad (K)$$

In Non-Patent Document 4, a comparison with the experimental results is made by ignoring an effect of the residual oxygen concentration corresponding to the τ1 term and taking into consideration just the τ2 term estimated based on L=1/N1/3. As is described below, we have found that both τ1 and τ2 terms determine the slip generating stress.

Thus, the strength against the slip is described by the solid solution oxygen concentration, and the density and the diameter of the oxygen precipitates. It is considered that the slip occurs when the shear stress that exceeds the strength against the slip given by Formula (K) is applied.

Here, although the solid solution oxygen concentration and the density of the oxygen precipitates among the solid solution oxygen concentration and the density and the diameter of the oxygen precipitates can be directly evaluated easily, some ingenuity is required to evaluate the diameter of the oxygen precipitates. For example, the following three methods may be mentioned as the evaluation method.

One is a method of a direct evaluation by the transmission electron microscope. Although this method is highest in precision, it is not so practical.

The second method is a method of determining the volume per single precipitate by dividing a value of the amount of the oxygen precipitates by the density thereof while the amount of the oxygen precipitates may be obtained by evaluating the differences between the initial oxygen concentration before the heat treatment and the post oxygen concentration after the heat treatment with the FTIR measurement. Since an axial ratio determined by dividing the thickness by the diameter is usually approximately 0.01 with respect to the plate-like oxygen precipitate, the diameter under the assumption that the precipitate is in a disk shape can be determined if the volume per single precipitate is given. This is the second method and in the case where the precipitated oxygen amount can be measured, a simple evaluation can be made by this method. In this case, it is preferable to conduct the correction of an oxygen decrease amount due to the external diffusion of the oxygen during the heat treatment.

The third method is a method of determination by calculation. It is known that the oxygen precipitates grow according to the growing theory based on the rate determination factor of the oxygen diffusion in the heat treatment such that it is easy to calculate the diameter of the grown oxygen precipitates by the calculation method as disclosed, for example, in Patent Document 10 assuming the oxygen precipitates are in sphere. The method of converting the diameter of the sphere having been determined as described above into the diameter of the disk having the axial ration of 0.01 and the same volume is the third method.

The second and third methods are simple and it is possible to estimate the strength of the crystal satisfactorily utilizing either method.

It was confirmed by the following experiments that the slip is generated when the sum of the thermal stress and the self-weight stress exceeds the estimated strength against the slip of the wafer.

The experiments were performed as a high temperature annealing experiment of annealing a wafer of 300 (mm) diameter for 2 hours at 1200 (° C.). As a temperature increasing process, a process, in which it was confirmed that the slip was generated near 1100 (° C.) during the temperature increase in a wafer having no oxygen precipitates introduced, was employed. It was confirmed that the slip was generated near 1100 (° C.) during the temperature increase by performing experiments of interrupting the temperature increase (and gradually cooling) at different interruption temperatures during the temperature increase process. The maximum value of the sums of the self-weight stress and the thermal stress at 1100 (° C.) in the twelve types of slip systems in the present experiment is a shear force of 1.4 (MPa).

The above temperature increase process was then applied to wafers having various residual solid solution oxygen concentrations and oxygen precipitate densities and diameters, and the wafers were examined by the X-ray topography so as to determine whether or not the slip was generated. If the slip is generated, it is generated at a portion of contact with a four-point supporting boat and progresses in a <110> direction.

Figure 4:
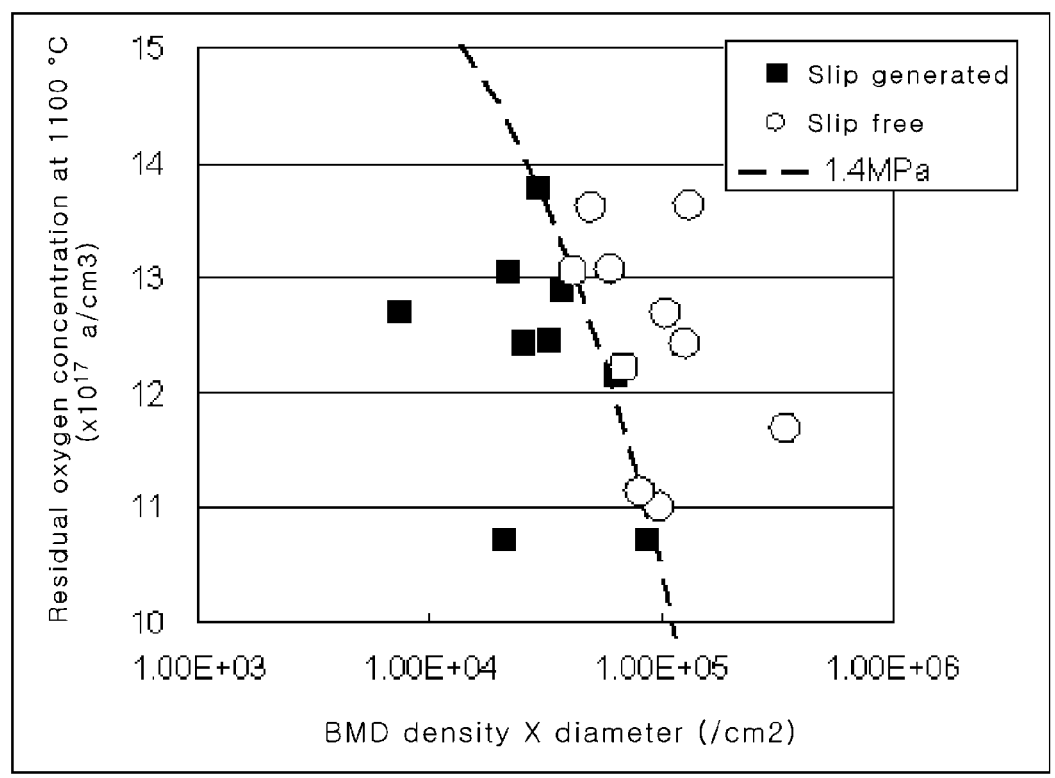
FIG. 4 is a graph showing existence or nonexistence of slip generation based on residual solid solution oxygen concentration and density of oxygen precipitates.

In FIG. 4, open circles referring to wafers in which no slip was generated and black squares referring to wafers in which the slip was generated are plotted in the graph with the horizontal axis of the product of the oxygen precipitate density and diameter and the vertical axis of the residual solid solution oxygen concentration. The first term of Formula (K) is proportional to the value along the vertical axis in the figure, and the second term of Formula (K) is proportional to a square root of the value along the horizontal axis in the figure. A contour line that provides the strength against the slip corresponding to 1.4 (MPa), which is the sum of the self-weight stress and the thermal stress, is indicated by a dotted line in the figure.

From the figure, it was confirmed that the slip was not generated when the strength against the slip was greater than 1.4 (MPa). It was also confirmed that, as predicted by Formula (K), the slip generation limit boundary depends on the residual solid solution oxygen concentration and the density and the diameter of the oxygen precipitates.

Figure 5:
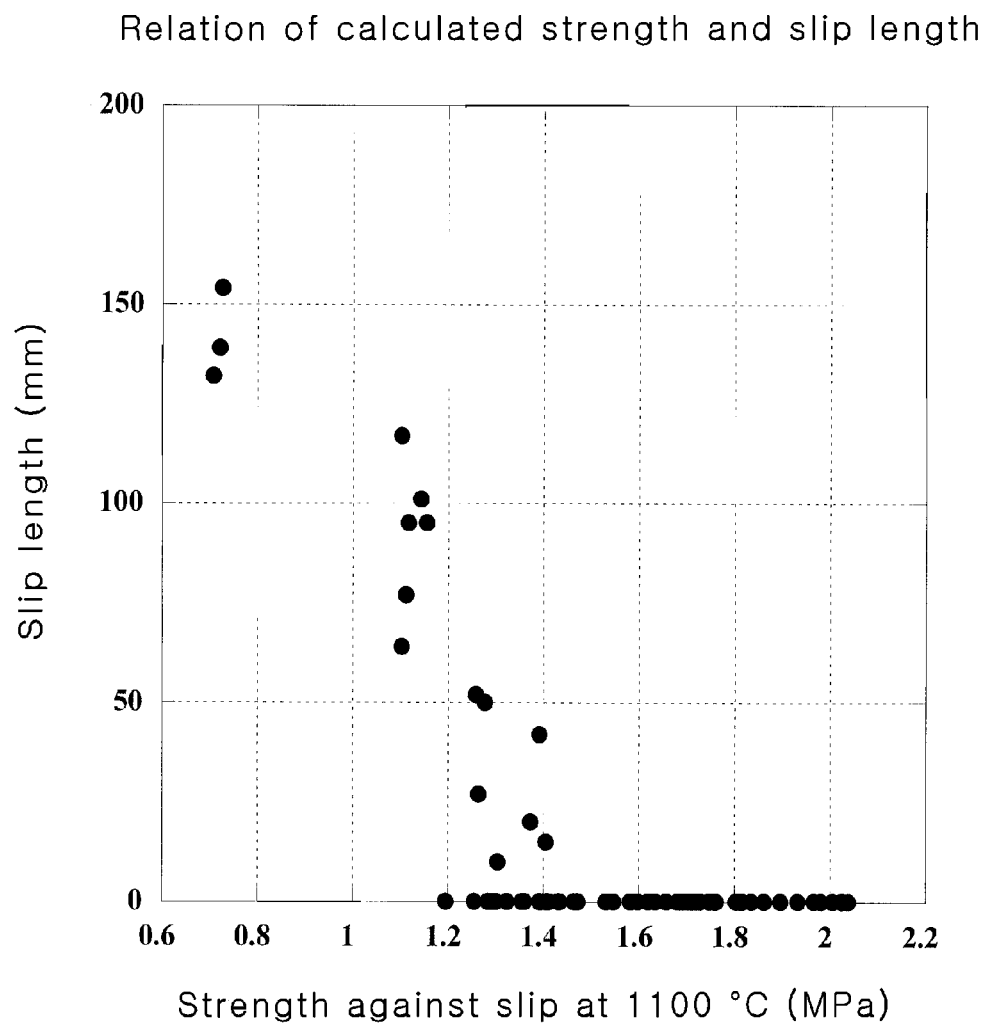
FIG. 5 is a graph showing the relationship between calculated strength and slip length.

FIG. 5 shows the relationship of the strength of the crystal estimated by Formula (K) and a slip length under the test conditions in which the results shown in FIG. 4 were obtained. As shown in FIG. 5, it can be understood that the slip length can be estimated by Formula (K).

Similar experiments were then conducted with the thermal stress being varied by changing the rate of temperature increase to examine the slip generation state and examine the relationship with respect to the strength against the slip provided by Formula (K).

Figure 6:
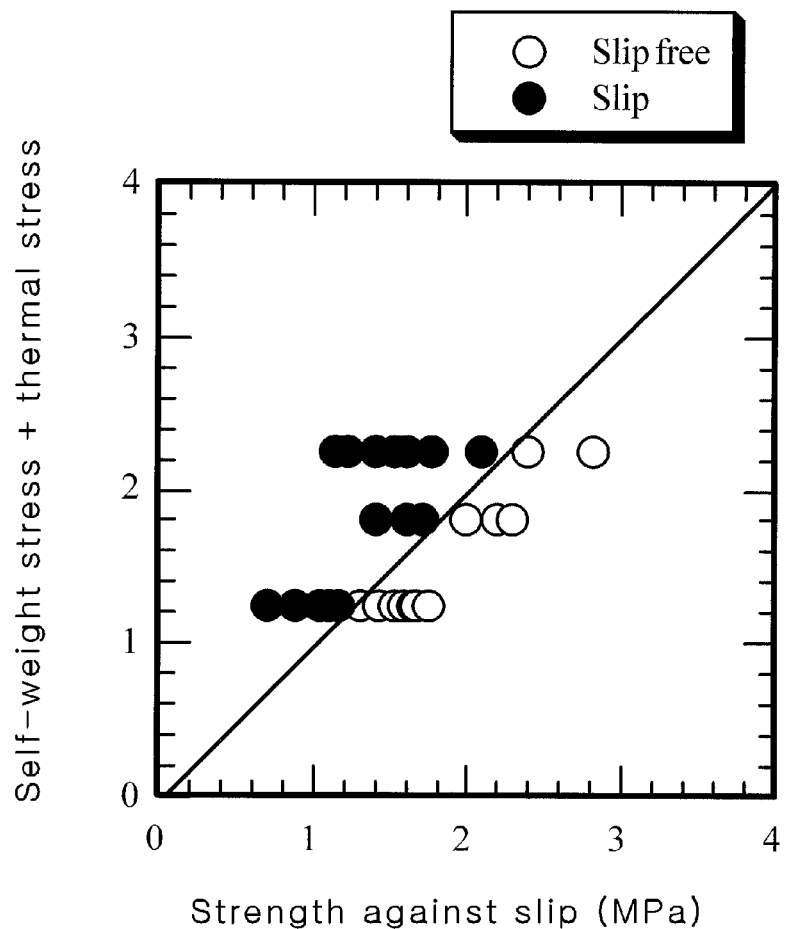
FIG. 6 is a graph showing existence or nonexistence of slip generation based on strength against the slip and a sum of a thermal stress and a self-weight stress.

As shown in FIG. 6, open circles referring to the conditions under which the slip was not generated and closed circles referring the conditions under which the slip was generated are plotted in the graph with the horizontal axis of the strength against the slip predicted by Formula (K) and the vertical axis of the sum of self-weight stress and the thermal stress. It was thus confirmed that the strength against the slip can be predicted by Formula (K).

As mentioned above, it was found that the strength against the slip generation can be predicted by Formula (K). From an examination of Formula (K), it can be understood that an oxygen precipitation state that most fortifies an anti-slip property in a silicon wafer with a certain initial oxygen concentration can be predicted.

It is well known that the density of oxygen precipitates depends on a heat treatment process in the range of 500 (° C.) to 900 (° C.). That is, the density can be controlled readily by means of a holding time and a rate of temperature increase in a heat treatment process in the range of 500 (° C.) to 900 (° C.). Many reports, including Patent Document 10, have been made regarding this. Meanwhile, the precipitated oxygen amount varies according to a process time at 900 (° C.) or higher. This is because the growth of oxygen precipitates is extremely slow at equal to or less than 900 (° C.). As a characteristic of oxygen precipitation, nucleus formation does not occur at 900 (° C.) or higher, and thus oxygen precipitates exhibit only a growth phenomenon and only the size of the precipitates change at a high temperature. The precipitated oxygen amount thus changes at the high temperature. Meanwhile, at a low temperature, the growth rate is extremely slow, hardly any change in oxygen precipitation amount is exhibited, and only nucleus formation is prominent. That is, a variation of number (density) is prominent. Oxygen precipitates thus have a property that temperature zones of generation and growth are divided. The density and the precipitated oxygen amount can thus be controlled independently in designing the process.

Under the above premise, the oxygen precipitate diameter and the residual oxygen concentration can be derived readily by calculation. The calculation method shall now be described specifically.

Here, the oxygen precipitate diameter and the precipitated oxygen amount Cp according to the growth of the oxygen precipitates after the density N has been determined by a process between 500 (° C.) and 900 (° C.) are determined by calculation. As is well known, the diameter of an oxygen precipitate as a sphere can be determined by Formulae (L) and (M) as shown below.

[Formula 12]

$$\frac{\partial R(t)}{\partial t} = \frac{D\Omega}{R(t)}(C_o - Ci) \tag{L}$$

[Formula 13]

$$Ci = C^{eq} \times \exp(2\Omega\sigma/(RkT)) \tag{M}$$

Here, R(t) is a radius of the oxygen precipitate at a time t, D is a diffusion coefficient of oxygen, Co is a residual oxygen concentration, Ci is an oxygen concentration in silicon at an interface of the oxygen precipitate, Ceq is a thermal equilibrium concentration of oxygen, σ is an interface energy between silicon and the oxygen precipitate, and Ω is a volume per oxygen atom in SiO2.

Formula (L) expresses a rate of increase of the radius with time. By setting an initial radius to an extremely small value, that is, to approximately 1 nm and adding increments of radius according to time, the radius of the oxygen precipitate can be determined.

Variation of the residual oxygen concentration, that is, the variation of the precipitated oxygen amount is given by Formula (N) as shown below.

[Formula 14]

$$\frac{\partial C(t)}{\partial t} = 4\pi \cdot D \cdot R(t) \cdot N \cdot (C_o - C_i) \tag{N}$$

The rate of increase of the precipitated oxygen amount Cp is expressed by Formula (N) and by integration thereof, the precipitated oxygen amount can be determined. The residual oxygen concentration Co varies constantly as the initial oxygen concentration minus the precipitated oxygen amount. By performing numerical calculation by applying the present calculation procedure to all stages of the heat treatment process, the oxygen precipitate diameter and the residual oxygen concentration can be determined.

The diameter D of a plate-like oxygen precipitate is determined by conversion to the diameter of a disk of the same volume as the spherical oxygen precipitate by Formula (O) as shown below.

[Formula 15]

$$D = (16/3\epsilon)^{1/3} \cdot R \tag{O}$$

Here, ε is the axial ratio of the plate-like oxygen precipitate. The oxygen precipitate diameter and the residual oxygen concentration can be determined by the above procedures.

It can be understood that it is extremely useful to be able to use the above properties to predict the oxygen precipitation amount that most fortifies the slip resistance when oxygen precipitates of a certain density are introduced by a heat treatment process from 500 (° C.) to 900 (° C.) in a silicon wafer having a certain initial oxygen concentration.

A method for estimating the optimal oxygen precipitation amount shall now be described. Here, it shall be assumed that the oxygen precipitates are disks. As the oxygen concentration, an equivalent concentration value according to JEITA is used.

Initial oxygen concentration: Ci (atoms/cm3)
Precipitated oxygen amount:
Cp (atoms/cm3)
Residual oxygen concentration:
Co=Ci−Cp (atoms/cm3)
Plate-like oxygen precipitate density:
N (counts/cm-3)
Plate-like oxygen precipitate diameter:
D={4 ΩCp/(επ·N)}1/3
plate-like oxygen precipitate thickness: t
plate-like oxygen precipitate axial ratio:
ε=t/D
Volume per oxygen atom in SiO2:
Ω=2.21×10-23 (cm-3)

By assuming as described above, Formula (K) can be expressed as Formula (P) as shown below, that is, as an expression using the four process parameters of the initial oxygen concentration, the precipitated oxygen concentration, the oxygen precipitation density, and the axial ratio of the oxygen precipitates.

[Formula 16]

$$\tau = 2.2 \times 10^{-13} \cdot (C_i - C_p) \cdot \exp(0.215 \text{ eV}/kT) + \mu \cdot b \cdot \{4\Omega/(\epsilon \cdot \pi)\}^{1/6} \cdot \cos(54.7°)^{1/2} \cdot N^{1/3} \cdot C_p^{1/6} \tag{P}$$

Figure 7:
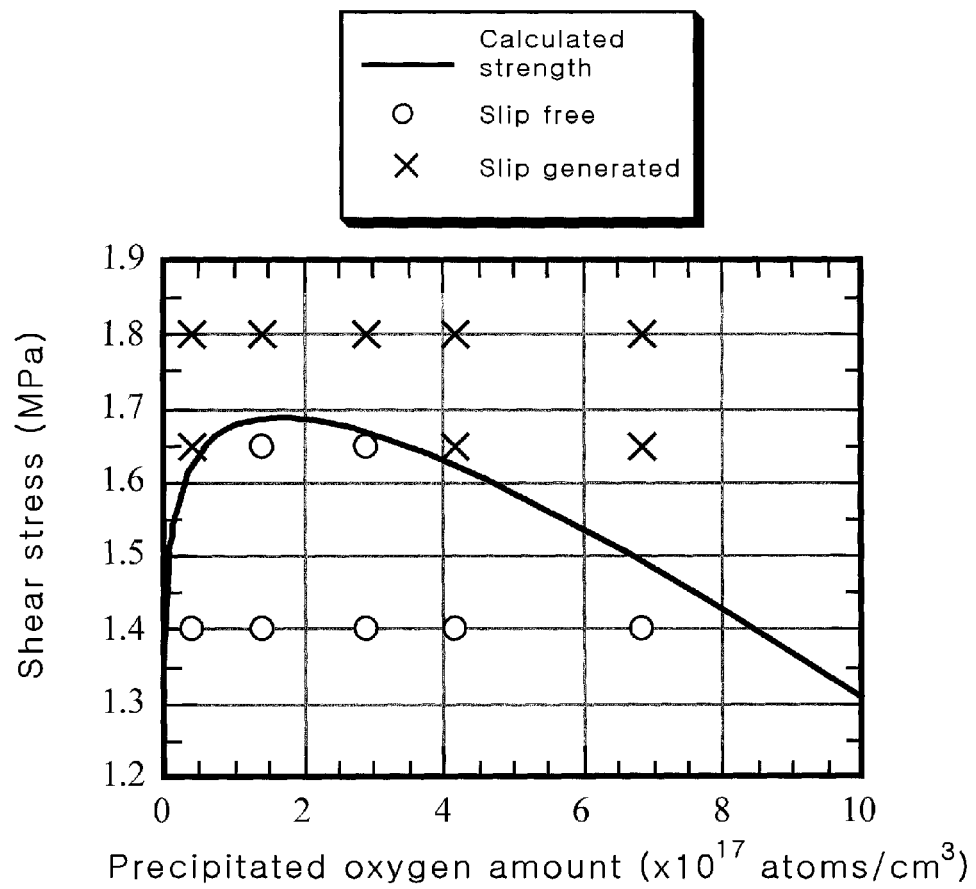
FIG. 7 is a graph showing the relationship between oxygen precipitation amount and strength.

A solid line in FIG. 7 indicates the relationship of the precipitated oxygen amount and the strength against the slip according to Formula (P) in the case where the initial oxygen concentration is 1×1017 (atoms/cm3, old ASTM standard concentration value). Here, the density of the oxygen precipitates is set to 5×109 (counts/cm3), the axial ratio is set to the general value of 0.01, and the temperature is set to 1100° C.

From FIG. 7, it can be understood that the strength first increases as the precipitated oxygen amount increases but that the strength decreases after the precipitated oxygen concentration exceeds a specific value. This is because the effect of lowering the strength by lowering the residual oxygen concentration surpasses the effect of increasing the strength by the oxygen precipitates.

The precipitated oxygen amount that provides such maximum strength is the optimal precipitation state in terms of the strength of the wafer and it can be mentioned that it is the ideal state for avoiding the slip generation.

The present inventors have confirmed by the experiments that the oxygen precipitation amount to be expected by Formula (P) corresponds to the strongest state against the slip generation.

Using a wafer with an initial oxygen concentration of 13×1017 (atoms/cm3, old ASTM) and being made to have a density of oxygen precipitates of 5×109 (counts/cm3) by the heat treatment at 800 (° C.) for 4 hours, the precipitated oxygen amount was varied by changing the temperature and the time of the heat treatment at 1000 (° C.) or 1050 (° C.) from 6 hours to 64 hours. Thus, the wafers having the density of oxygen precipitates set to be 5×109 (counts/cm3) and the precipitated oxygen amount set to be from 0.4×1017 to 6.9× 1017 (atoms/cm3, old ASTM) were heat treated with loaded stress such that the slip generation in such wafers was investigated. In the loaded stress, the maximum shear stress was set to be 1.4, 1.65, and 1.8 (MPa) by changing the rate of temperature increase. In FIG. 7, circled plots indicate wafer conditions under which the slip was not generated and crossed plots indicate wafer conditions under which the slip was generated. As shown in the figure, the optimal precipitation condition predicted by the calculation formula according to the present invention corresponds to the strongest region against the slip.

The precipitated oxygen amount at which the strength against the slip becomes the highest can also be obtained by differentiating Formula (P) with respect to the precipitated oxygen concentration Cp and determining the Cp at which dτ/dCp=0. The solution is expressed by Formulae (Q) and (R) as shown below.

[Formula 17]

$$C_p = A \cdot N^{2/5} \quad (Q)$$

[Formula 18]

$$A = [1.32 \times 10^{-12} \cdot \exp(0.215 \text{ eV}/kT) \cdot (\epsilon\pi)^{1/6} / \{\mu \cdot b \cdot \cos(54.7°)^{1/2} \cdot (4\Omega)^{1/6}\}]^{-6/5} \quad (R)$$

Figure 8:
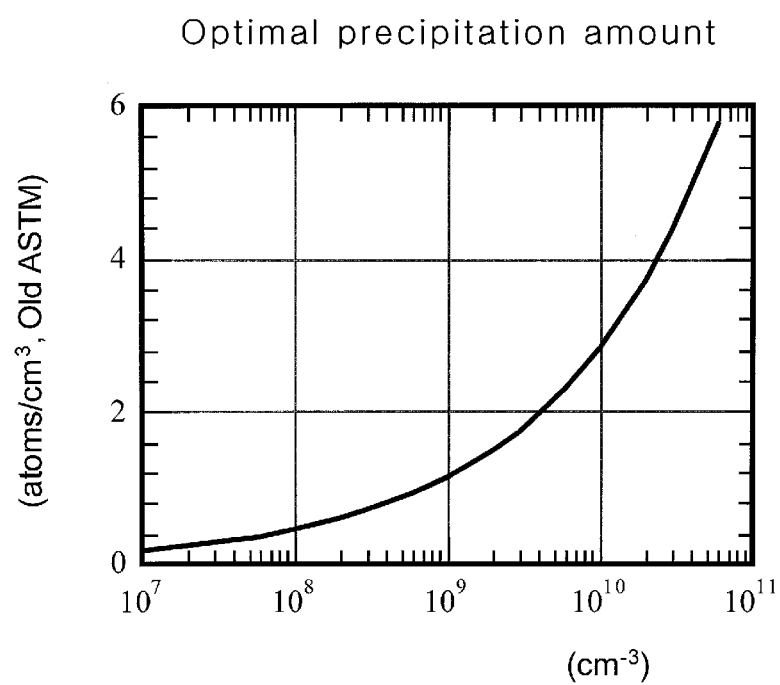
FIG. 8 is a graph showing optimal oxygen precipitation amount.

The precipitated oxygen concentration that provides the maximum strength is not dependent on the initial oxygen concentration and can be expressed by the two process parameters of the density and the axial ratio of the oxygen precipitates. FIG. 8 shows a relationship of N representing the density of oxygen precipitates, and Cp representing the precipitated oxygen concentration (old ASTM standard concentration value) that provides the maximum strength. Here, the axial ratio of the oxygen precipitates is set to be the generally-employed value of 0.01 and the temperature is set to be 1100 (° C.). It is meant that the strength of the wafer is lowered if the precipitated oxygen concentration exceeds the value shown in FIG. 8 at each density of the oxygen precipitates.

Figure 9:
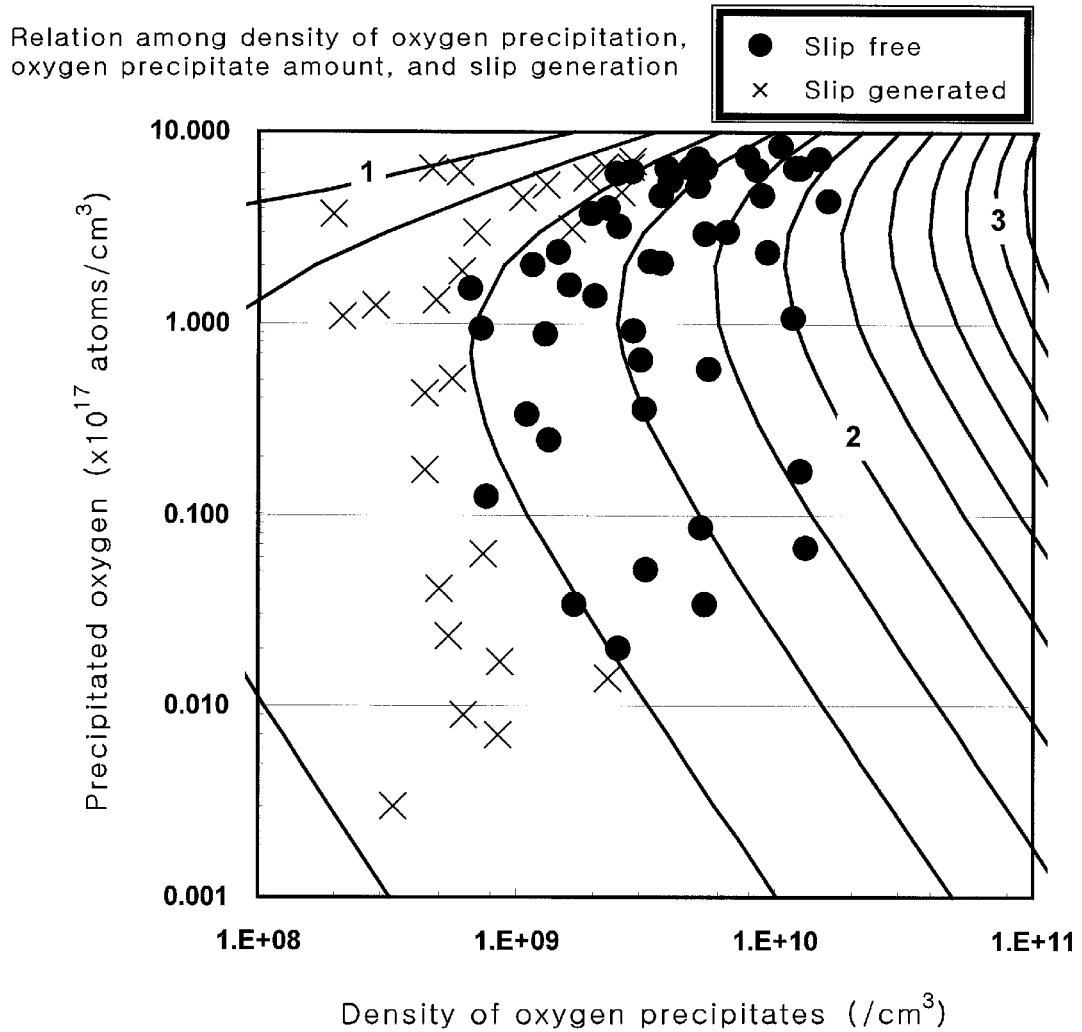
FIG. 9 is a graph showing the relationship among density of oxygen precipitate, oxygen precipitation amount, and existence of slip.

FIG. 9 shows how the slip generation occurred in a wide range of oxygen precipitate density and oxygen precipitate amount. The initial oxygen concentration is 13×1017 (atoms/cm3, old ASTM), and the conditions of the slip generation experiments are the same as those of FIG. 4. Contour lines shown in the figure indicate the strength of the crystal predicted by Formula (P). In the figure, circled plots indicate wafer conditions under which the slip was not generated and crossed plots indicate wafer conditions under which the slip was generated. It can be understood that the optimal precipitation state, as shown in the figure, can be predicted by the calculation formula according to the present invention.

From FIGS. 7, 8, and 9, it can be understood that the oxygen precipitation amount with which the strength becomes the highest can be predicted when the initial oxygen concentration is set and the density of the oxygen precipitates is determined.

That is, the optimal precipitation state can be predicted using FIGS. 7 to 9 such that the conditions can be controlled accordingly. Although the case where the initial oxygen concentration is 13×1017 (atoms/cm3, old ASTM) is shown in FIGS. 7 to 9, it goes without saying that the optimal oxygen precipitation amount can be predicted by this method in the case of the other initial oxygen concentrations.

The following method, for example, can be considered to obtain the optimal oxygen precipitation. The density N of the oxygen precipitates is determined by the heat treatment conditions of the low temperature heat treatment, but is not affected by the heat treatment conditions of the high temperature heat treatment. Thus, the density N of the oxygen precipitates predicted to be the optimal one for the silicon wafer to be heat treated is determined, and the heat treatment conditions for the low temperature heat treatment are arranged, and then the density of the oxygen precipitates in the silicon wafer is adjusted to be this value of N. Next, the oxygen precipitation amount Cp is increased by the heat treatment at a higher temperature and the heat treatment is terminated before the oxygen precipitation amount Cp exceeds the curve shown in FIG. 8. More specifically, the holding time and the rate of temperature increase are adjusted in the temperature range of 500 (° C.) to 900 (° C.), more preferably the temperature range of 600 (° C.) to 800 (° C.), and even more preferably the temperature range of 650 (° C.) to 700 (° C.), and the density N of 1010 (counts/cm3) of the oxygen precipitates, for example, is obtained in FIG. 8. Here, in general, the density N of the oxygen precipitates increases as the holding time is made longer or the rate of temperature increase is made lower. Also, a change of free energy by the nucleus formation which is a driving force to form the nucleus of the oxygen precipitates, a diffusion energy for movement of oxygen, a temperature of the silicon wafer, and so on are important factors and it is, therefore, considered important to secure the optimal holding time in the optimal temperature range, for example.

Next, moving substantially in a perpendicular direction at the value of 1010 (counts/cm3) in FIG. 8 corresponds to increasing the oxygen precipitation amount Cp by the high temperature heat treatment. For example, the holding time and the rate of temperature increase are adjusted in the temperature range of 900 (° C.) to 1300 (° C.), more preferably the temperature range of 900 (° C.) to 1100 (° C.), and even more preferably the temperature range of 950 (° C.) to 1050 (° C.) so that the oxygen precipitation amount Cp is equal to or less than the value at which the oxygen precipitate density N is equal to 1010 (counts/cm3) along the curve shown in FIG. 8. Here, in general, the oxygen precipitation amount Cp increases as the holding time is made longer or the rate of temperature increase is made lower. Also, a change of free energy of silicon due to solid solution oxygen that is a driving force of oxygen precipitation, the diffusion energy for movement of oxygen, the temperature of the silicon wafer, and so on are important factors and it is thus considered important to secure, for example, the optimal holding time in the optimal temperature range.

As described above, the present invention can provide the following.

(1) A method for heat treating a silicon wafer containing a predetermined amount of solid solution oxygen, comprising the steps of: determining a shear stress generated in a heat treatment process from a size, a shape, and a way of holding during treatment of the silicon wafer; determining a heat treatment condition that effectively suppress slip by comparing the shear stress with a strength against a slip determined from a residual solid solution oxygen and an amount and a shape of precipitated oxygen; and performing the heat treatment under the condition.

Here, the size of the silicon wafer may mean a diameter of a disk shape such as 200 mm or 300 mm. In particular, this size directly influences the weight of the silicon wafer and is related to the method of holding the silicon wafer. The shape may signify whether the silicon wafer is a thin plate or a thick plate, whether the thickness is fixed (or variable), whether the wafer is in a disk shape, rectangular, or the like. These directly influence the weight of the silicon wafer and influence how the thermal stress is generated by the temperature increase or decrease during the heat treatment. The method of holding the wafer during treatment may signify, for example, placing the silicon wafer horizontally on a tray or vertically on the tray, and supporting the silicon wafer on three points, four points, or more points, and hanging the silicon wafer by pinching a corner thereof or a edge thereof, and so on. To effectively suppress the slip may signify prevention of generation of the slip such that the slip does not create any factors to damage the semiconductor device as the product, and that, for example, no slip to be detected is generated.

(2) A method for heat treating a silicon wafer, comprising the step of: performing a heat treatment under a condition enabling an amount of oxygen precipitation and a density of oxygen precipitates that effectively suppress a slip in a silicon wafer to which oxygen is added.

Here, the density of oxygen precipitates and the precipitated oxygen amount capable of effectively suppressing the slip may differ according to various types of wafers, and in the relationship between the density of oxygen precipitates and the precipitated oxygen amount, the relationship according to Formula (Q) based on Formula (P) may be maintained.

(3) The method for heat treating the silicon wafer according to the above (1) or (2), comprising the steps of: adjusting a holding time period and a rate of temperature increase during a temperature range from 500 (° C.) to 900 (° C.) so as to adjust the density of the oxygen precipitates in the heat treatment; adjusting a holding time period and a rate of temperature increase during a temperature range from 900 (° C.) to 1300 (° C.) so as to adjust the amount of oxygen precipitation in the heat treatment.

Here, the holding time and the rate of temperature increase in the predetermined temperature range may be determined by calculation or may be optimized by the experiments having been conducted in advance. For example, silicon wafers containing a predetermined amount of oxygen are prepared, an experiment of holding the silicon wafers for a predetermined time and increasing the temperature in the predetermined temperature range from 500 (° C.) to 900 (° C.) is performed, and the density of the formed oxygen precipitates are measured. In order to facilitate the measurement, if necessary, a predetermined heat treatment for growing the formed oxygen precipitates may be performed additionally. Thus, the conditions to prepare silicon wafers having a predetermined density of oxygen precipitates from silicon wafers containing a predetermined amount of oxygen are determined.

Next, silicon wafers containing the predetermined density of oxygen precipitates are prepared, an experiment under the condition of the changed holding time and the changed rate of temperature increase in the predetermined temperature range of 900 (° C.) to 1300 (° C.) is performed, and the conditions to obtain a predetermined precipitated oxygen amount are determined. That is, from the above-described experiments, the heat treatment conditions to obtain a silicon wafer having the predetermined density of oxygen precipitates and the predetermined precipitated oxygen amount from a silicon wafer containing a predetermined amount of oxygen are determined.

(4) A method for heat treating a silicon wafer to which oxygen is added, comprising the steps of: determining in advance a strength $\tau 1$ to suppress a slip based on solid solution oxygen and a strength $\tau 2$ to suppress the slip based on precipitated oxygen to determine a rate R of temperature increase/decrease such that a shear stress S caused by a thermal stress and a holding way of the silicon wafer to which the oxygen is added does not exceed a sum of the strength $\tau 1$ based on the solid solution oxygen and strength $\tau 2$ based on the precipitated oxygen to suppress the slip; calculating a critical rate of temperature increase/decrease from a relationship of a wafer diameter and an interval distance between wafers in a heat treatment so as to prevent the slip; and performing the heat treatment of the wafer with a rate of temperature increase/decrease not exceeding the calculated rate R so as to prevent the slip in the heat treatment.

(5) A method for determining a condition for heat treating a silicon wafer containing a predetermined amount of solid solution oxygen, comprising the step of: adjusting the condition so as to obtain a strength higher than a shear stress generated in a heat treatment step by utilizing a predetermined theoretical formula capable of calculating the strength against a slip.

(6) The method for determining the condition for heat treating the silicon wafer according to the above (5) wherein the predetermined theoretical formula is:

[Formula 19]

$$\tau = 1.28 \times 10^{-13} \cdot Co \cdot \exp(0.215 \text{ eV}/kT) + \mu \cdot b \cdot (N \cdot D \cdot \cos(54.7°))^{1/2}$$ [Formula 19]

(7) A method for heat treatment of a silicon wafer wherein the condition determined by the method recited in the above (5) or (6) is employed for the heat treatment.

(8) A silicon wafer heat treated using the above heat treatment method.

In the present invention, an oxygen precipitation state of a wafer in which a slip is not generated by a stress generated in a heat treatment process can be estimated simply without performing troublesome trial-and-error experiments. A heat treatment process, in which the slip is not generated, can be designed readily for the oxygen precipitation state of the wafer. The range of the density of the oxygen precipitates and the oxygen precipitation amount that are effective for suppression of the slip generation are found and a method for achieving such a state of oxygen precipitates is proposed.

An embodiment of the present invention shall now be described in detail based on the drawings. The same symbols refer to the same elements and redundant description is omitted.

A p-type silicon single crystal ingot doped with boron having nitrogen doping amounts of $5\times10^{13}$ to $1\times10^{14}$ (atoms/cm3) by calculation, oxygen contents of 9 to $14\times10^{17}$ (atoms/cm3), and electrical resistivity of approximately 1 to 20 ($\Omega\cdot$cm) was grown, and silicon wafers with mirror polished surfaces having a diameter of 300 (mm) ad a thickness of 775 (μm) were prepared from the ingot.

The mirror-polished wafers were loaded into a heat treatment furnace so as to be heat treated after they were washed. The heat treatment was performed in a vertical furnace using a heat treatment boat of a four-point support type for holding the wafer. A tip of each of the four-point supports is arranged at a position along a circle with a 105-(mm) radius from the center portion of the 300-(mm) wafer.

The wafers were loaded in and removed from the heat treatment furnace at the same unified speed of 50 (mm/min). A unified loading temperature was also set at 500° C. An interval distance w between loaded wafers was 9.5 (mm). A heat treatment atmosphere was set to a 100% Ar gas atmosphere, and a flow rate of Ar gas filling in the ambient atmosphere in the furnace was set to 45 (L/min). After the wafers were loaded in the heat treatment furnace, they were heat treated by being held therein in a temperature range of 500° C. to 800° C. for 1 to 4 hours as a low temperature heat treatment so as to form oxygen precipitate nuclei. A rate of the temperature increase was set in a range of 3 to 15 (° C./min) from the temperature at loading to the temperature of the low temperature heat treatment. After completion of the low temperature heat treatment, the wafers were held therein at 1000° C. for 1 to 16 hours as a medium temperature heat treatment so as to grow oxygen precipitate nuclei having been formed in the low temperature heat treatment. The temperature was raised from the low temperature treatment to the medium temperature heat treatment at a rate of 3 to 10 (° C./min). After completion of the medium temperature heat treatment, a high temperature heat treatment of retaining them at 1200 (° C.) was performed for 2 hours so as to form a surface layer COP free zone. After completion of the high temperature heat treatment, the interior of the heat treatment furnace was cooled down to 500° C., which is the takeout temperature, and the wafers were thereafter removed from the furnace.

The experiments having a total of 20 levels were conducted in order to prepare different wafers in the oxygen precipitation density, the oxygen precipitation size, and the residual solid solution oxygen concentration under the above-described conditions. It was expected that slip free wafers were produced in 10 of the 20 levels in accordance with Formula (K) and that slip generated wafers were produced in the rest 10 levels.

The heat treated wafers were examined by the XRT measurement such that it was determined whether each of the wafers had a slip or not. The results and the heat treatment conditions are shown in Table 1. In Table 1, values of the oxygen precipitation density, the plate-like oxygen precipitate diameter, and the residual oxygen concentration at 1100 (° C.) during the heat treatment were calculated by the above-mentioned calculation method.

Also, values τ of the strength against the slip were calculated by Formula (K) by substituting the above-mentioned oxygen precipitation density and the plate-like oxygen precipitate diameter which were derived by the simulation and it could be expected that no slip would be generated after the heat treatment if the value τ was equal to or more than 1.4 (MPa). As shown in Table 1, generation of slip was not detected as expected in the wafers having heat-treated under the heat treatment condition which was so designed that no slip might have been generated. On the other hand, it was confirmed that the rest 10 wafers as the comparative examples had actually slip generation as the slip generation was expected because the values τ of the strength against the slip were less than 1.4 MPa.

FIG. 4 is a diagram showing a relationship between the product of the oxygen precipitate density and the size thereof (calculated value), and the residual oxygen concentration (calculated value) at 1100 (° C.) where the slip was generated in the above-described experiments. A dotted line in the figure is a contour line indicating 1.4 (MPa), which is the sum of the self-weight stress and the thermal stress. Open circles indicate the slip free wafers and squares indicate the wafers in which slip generation was confirmed. From the results, it can be understood that no slip generation occurs in the wafer having the strength against the slip greater than 1.4 (MPa) and that slip generation occurs in the wafer having the strength against the slip smaller than 1.4 (MPa) such that it can be understood that the slip generation limit boundary is dependent on the product of the oxygen precipitation density and the oxygen precipitate diameter, and the solid solution oxygen concentration as predicted by Formula (K).

Here, the slip is not generated, for example, when the residual oxygen concentration is $13\times10^{17}$ (atoms/cm3), if the product of the oxygen precipitation density and the size thereof is equal to or larger than $5\times10^{4}$ (/cm2), whereas the slip is not generated over a wide range of the residual oxygen concentration of 11 to $14\times10^{17}$ (atoms/cm3) if the product of the oxygen precipitation density and the size thereof is equal to or larger than $1\times10^{5}$ (/cm2). Although the upper limit of the product of the oxygen precipitation density and the size thereof is not apparent from this figure, it is not preferable that the product of the oxygen precipitation density and the size thereof becomes too large because the strength of the wafer is caused to be lowered.

TABLE 1

| | Holding temp. at low temp. (° C.) | Holding time at low temp. (hr) | Temp. increase up to low holding temp. (° C./min) | Holding temp. at medium temp. (° C.) | Holding time at medium temp. (hr) | Temp. increase up to medium holding temp. (° C./min) | Initial oxygen concentration (×E17 a/cm3) | Oxygen precipitation density (×E17 a/cm3) | Plate-like oxygen precipitation diameter (nm) | Residual oxygen concentration (×E17 a/cm3) | Oxygen precipitation density × Diameter (cm-2) | Strength against slip (Mpa) | Slip length (mm) |
|---|---|---|---|---|---|---|---|---|---|---|---|---|---|
| Example 1 | 800 | 4 | 3 | 1000 | 6 | 3 | 11.24 | 4.27E+09 | 230.5 | 11.00 | 9.84E+04 | 1.43 | 0 |
| Example 2 | 800 | 4 | 3 | 1000 | 6 | 3 | 12.27 | 1.77E+09 | 248.7 | 12.22 | 6.89E+04 | 1.43 | 0 |
| Example 3 | 800 | 4 | 3 | 1000 | 6 | 3 | 12.89 | 5.06E+09 | 250.8 | 12.43 | 1.27E+05 | 1.62 | 0 |
| Example 4 | 800 | 4 | 3 | 1000 | 6 | 3 | 11.36 | 3.52E+09 | 252.5 | 11.14 | 8.19E+04 | 1.39 | 0 |
| Example 5 | 650 | 2 | 3 | 1000 | 6 | 5 | 13.80 | 1.88E+09 | 262.0 | 13.63 | 4.93E+04 | 1.47 | 0 |
| Example 6 | 500 | 4 | 3 | 1000 | 2 | 3 | 13.08 | 2.21E+09 | 189.2 | 13.06 | 4.18E+04 | 1.40 | 0 |
| Example 7 | 700 | 2 | 3 | 1000 | 1 | 3 | 13.72 | 7.80E+09 | 169.8 | 13.63 | 1.32E+05 | 1.73 | 0 |

TABLE 1-continued

| | Holding temp. at low temp. (° C.) | Holding time at low temp. (hr) | Temp. increase up to low holding temp. (° C./min) | Holding temp. at medium temp. (° C.) | Holding time at medium temp. (hr) | Temp. increase up to medium holding temp. (° C./min) | Initial oxygen concentration (×E17 a/cm3) | Oxygen precipitation density (×E17 a/cm3) | Plate-like oxygen precipitation diameter (nm) | Residual oxygen concentration (×E17 a/cm3) | Oxygen precipitation density × Diameter (cm-2) | Strength against slip (Mpa) | Slip length (mm) |
|---|---|---|---|---|---|---|---|---|---|---|---|---|---|
| Example 8 | 700 | 2 | 3 | 1000 | 16 | 3 | 13.24 | 9.41E+09 | 368.5 | 11.70 | 3.47E+05 | 1.98 | 0 |
| Example 9 | 700 | 2 | 5 | 1000 | 2 | 5 | 13.12 | 3.26E+09 | 185.0 | 13.07 | 6.03E+04 | 1.47 | 0 |
| Example 10 | 700 | 2 | 10 | 1000 | 2 | 5 | 12.80 | 5.82E+09 | 180.8 | 12.70 | 1.05E+05 | 1.58 | 0 |
| Comparative example 1 | 650 | 2 | 3 | 1000 | 6 | 5 | 12.73 | 2.99E+08 | 250.0 | 12.72 | 7.47E+03 | 1.16 | 95 |
| Comparative example 2 | 700 | 2 | 15 | 1000 | 2 | 10 | 13.07 | 1.21E+09 | 181.1 | 13.06 | 2.19E+04 | 1.29 | 66 |
| Comparative example 3 | 800 | 4 | 3 | 1000 | 6 | 3 | 10.77 | 9.18E+08 | 226.8 | 10.73 | 2.08E+04 | 1.10 | 64 |
| Comparative example 4 | 650 | 1 | 3 | 1000 | 6 | 5 | 13.84 | 1.11E+09 | 264.1 | 13.77 | 2.93E+04 | 1.39 | 42 |
| Comparative example 5 | 800 | 4 | 3 | 1000 | 9 | 3 | 8.82 | 8.11E+08 | 240.2 | 8.78 | 1.95E+04 | 0.94 | 38 |
| Comparative example 6 | 700 | 2 | 10 | 1000 | 2 | 10 | 13.06 | 2.07E+09 | 179.3 | 12.90 | 3.71E+04 | 1.36 | 31 |
| Comparative example 7 | 800 | 1 | 3 | 1000 | 1 | 3 | 12.45 | 1.73E+09 | 147.0 | 12.44 | 2.54E+04 | 1.27 | 27 |
| Comparative example 8 | 800 | 4 | 3 | 1000 | 6 | 3 | 10.93 | 3.82E+09 | 226.3 | 10.73 | 8.64E+04 | 1.37 | 20 |
| Comparative example 9 | 800 | 4 | 3 | 1000 | 6 | 3 | 12.20 | 2.52E+09 | 247.7 | 12.15 | 6.24E+04 | 1.41 | 15 |
| Comparative example 10 | 800 | 2 | 3 | 1000 | 1 | 3 | 12.47 | 2.20E+09 | 148.3 | 12.46 | 3.26E+04 | 1.31 | 10 |

What is claimed is:

1. A method for heat treating a silicon wafer containing a predetermined amount of solid solution oxygen, comprising the steps of:

determining a shear stress generated in a heat treatment process from a size, a shape, and a way of holding during treatment of the silicon wafer;

determining a strength against a slip determined from a residual solid solution oxygen and an amount and a shape of precipitated oxygen, the strength being given by $$\tau = \tau_1 + \tau_2 = 2.2 \times 10^{-13} \cdot Co \cdot \exp(0.215 \text{ eV}/kT) + \mu \cdot b \cdot (N \cdot D \cdot \cos(54.7°))^{1/2}$$ (K)

where Co is a solid solution oxygen concentration (atoms/cm³; JEITA), k is the Boltzmann constant, T is a temperature in the absolute temperature (K), b is a magnitude of the Burgers vector in the silicon crystal, and μ is a modulus of rigidity of the silicon crystal, N is a density of the oxygen precipitates, and D is a diameter of the oxygen precipitate;

determining a heat treatment condition that effectively suppresses slip by comparing the shear stress with the strength; and performing the heat treatment, by heat treatment furnace, under the condition.

2. A method for heat treating a silicon wafer, comprising the step of:

performing a heat treatment, by heat treatment furnace, under a condition enabling an amount of oxygen precipitation and a density of oxygen precipitates that effectively suppress a slip in a silicon wafer to which oxygen is added, wherein the condition is determined by utililizing $$\tau = \tau_1 + \tau_2 = 2.2 \times 10^{-13} \cdot Co \cdot \exp(0.215 \text{eV}/kT) + \mu \cdot b \cdot (N \cdot D \cdot \cos(54.7°))^{1/2}$$ (K)

where Co is a solid solution oxygen concentration (atoms/cm³; JEITA), k is the Boltzmann constant, T is a temperature in the absolute temperature (K), b is a magnitude of the Burgers vector in the silicon crystal, and μ is a modulus of rigidity of the silicon crystal, N is a density of the oxygen precipitates, and D is a diameter of the oxygen precipitate.

3. The method for heat treating the silicon wafer according to claim 1, comprising the steps of:

adjusting a holding time period and a rate of temperature increase during a temperature range from 500(° C.) to 900(° C.) so as to adjust the density of the oxygen precipitates in the heat treatment;

adjusting a holding time period and a rate of temperature increase during a temperature range from 900(° C.) to 1300(° C.) so as to adjust the amount of oxygen precipitation in the heat treatment, wherein both rates of temperature increases are determined in the step of determining the strength.

4. A method for heat treating a silicon wafer to which oxygen is added, comprising the steps of:

determining in advance a strength $T_1$ to suppress a slip based on solid solution oxygen and a strength $T_2$ to suppress the slip based on precipitated oxygen to determine a rate R of temperature increase/decrease such that a shear stress S caused by a thermal stress and a holding way of the silicon wafer to which the oxygen is added does not exceed a sum of the strength $T_1$ based on the solid solution oxygen and strength $T_2$ based on the precipitated oxygen to suppress the slip, wherein the strength is given by $$\tau = \tau_1 + \tau_2 = 2.2 \times 10^{-13} \cdot Co \cdot \exp(0.215 \text{eV}/kT) + \mu \cdot b \cdot (N \cdot D \cdot \cos(54.7°))^{1/2}$$ (K)

where Co is a solid solution oxygen concentration (atoms/cm³; JEITA), k is the Boltzmann constant, T is a temperature in the absolute temperature (K), b is a magnitude of the Burgers vector in the silicon crystal, and μ is a modulus of rigidity of the silicon crystal, N is a density of the oxygen precipitates, and D is a diameter of the oxygen precipitate;

calculating a critical rate of temperature increase/decrease from a relationship of a wafer diameter and an interval distance between wafers in a heat treatment so as to prevent the slip; and performing the heat treatment, by heat treatment furnace, of the wafer with a rate of temperature increase/decrease not exceeding the calculated rate R so as to prevent the slip in the heat treatment.

5. A method for determining a condition for heat treating a silicon wafer containing a predetermined amount of solid solution oxygen, comprising the steps of:

adjusting the condition so as to obtain a strength higher than a shear stress generated in a heat treatment step by utilizing a predetermined theoretical formula capable of calculating the strength against a slip;

determining a shear stress generated in a heat treatment process from a size, a shape, and a way of holding during treatment of the silicon wafer;

determining a strength against a slip determined from a residual solid solution oxygen and an amount and a shape of precipitated oxygen, the strength being given by $$\tau = \tau_1 + \tau_2 = 2.2 \times 10^{-13} \cdot Co \cdot \exp(0.215 \text{eV}/kT) + \mu \cdot b \cdot (N \cdot D \cdot \cos(54.7°))^{1/2} \quad (K)$$

where Co is a solid solution oxygen concentration (atoms/cm$^3$; JEITA), k is the Boltzmann constant, T is a temperature in the absolute temperature (K), b is a magnitude of the Burgers vector in the silicon crystal, and μ is a modulus of rigidity of the silicon crystal, N is a density of the oxygen precipitates, and D is a diameter of the oxygen precipitate;

determining a heat treatment condition that effectively suppresses slip by comparing the shear stress with the strength; and performing the heat treatment, by heat treatment furnace, under the condition.

6. A silicon wafer heat treated utilizing the method for the heat treatment, by heat treatment furnace, as recited in claim 1.

7. The method for heat treating the silicon wafer according to claim 2, comprising the steps of:

adjusting a holding time period and a rate of temperature increase during a temperature range from 500(° C.) to 900(° C.) so as to adjust the density of the oxygen precipitates in the heat treatment;

adjusting a holding time period and a rate of temperature increase during a temperature range from 900(° C.) to 1300(° C.) so as to adjust the amount of oxygen precipitation in the heat treatment, wherein both rates of temperature increases are determined in the step of determining the strength.

* * * * *